US 6,297,154 B1

(12) United States Patent
Gross et al.

(10) Patent No.: US 6,297,154 B1
(45) Date of Patent: Oct. 2, 2001

(54) PROCESS FOR SEMICONDUCTOR DEVICE FABRICATION HAVING COPPER INTERCONNECTS

(75) Inventors: Michal Edith Gross, Summit; Christoph Lingk, Berkeley Heights, both of NJ (US)

(73) Assignee: Agere System Guardian Corp., Orlando, FL (US)

( * ) Notice: Subject to any disclaimer, the term of this patent is extended or adjusted under 35 U.S.C. 154(b) by 0 days.

(21) Appl. No.: 09/143,037

(22) Filed: Aug. 28, 1998

(51) Int. Cl.$^7$ .................................................. H01L 21/44
(52) U.S. Cl. ..................... 438/663; 438/660; 438/674; 438/675; 438/687
(58) Field of Search ..................... 438/576, 618, 438/627, 637, 641, 660, 663, 674, 675, 687

(56) References Cited

U.S. PATENT DOCUMENTS

| | | | |
|---|---|---|---|
| 4,539,222 | 9/1985 | Anderson, Jr. et al. | 427/88 |
| 4,891,069 | * 1/1990 | Holtzman et al. | 106/1.15 |
| 5,164,332 | 11/1992 | Kumar | 437/198 |
| 5,314,756 | * 5/1994 | Tagaya | 428/546 |
| 5,612,254 | 3/1997 | Mu et al. | 437/195 |
| 5,627,102 | 5/1997 | Shinriki et al. | 437/192 |
| 5,814,557 | * 9/1998 | Venkatraman et al. | 438/622 |
| 5,893,752 | * 4/1999 | Zhang et al. | 438/687 |
| 5,939,788 | * 8/1999 | McTeer | 257/751 |
| 5,969,422 | * 10/1999 | Ting et al. | 257/762 |
| 6,001,730 | * 12/1999 | Farkas et al. | 438/627 |
| 6,043,153 | * 3/2000 | Nogami et al. | 438/687 |
| 6,126,761 | * 10/2000 | DeHaven et al. | 148/518 |

FOREIGN PATENT DOCUMENTS

| | | | |
|---|---|---|---|
| 0751567A2 | 1/1997 | (EP) | H01L/23/532 |
| 404120290 | * 4/1992 | (JP) . | |
| WO 98/27585 | 6/1998 | (WO) | H01L/21/768 |

OTHER PUBLICATIONS

J. Vac. Sci. Technol. B 15(4), "Microstructure control in semiconductor metallization", J.M.E. Harper and K.P. Rodbell, pp. 763–779, Jul./Aug. 1997.
J. Appl. Phys., vol. 43, No. 3, "The Structure of Electroplated and Vapor–Deposited Copper Films", A. Gangulee, pp. 867–873, Mar. 1972.
Journal of Applied Physics, vol. 45, No. 9, "Structure of electroplated and vapor–deposited copper films.III. Recrystallization and grain growth", A. Gangulee, pp. 3749–3756, Sep. 1974.
Materials Research Society Proceedings, vol. 514, "Microstructure and Texture of Electroplated Copper in Damascene Structures", M.E. Gross, et al., 1998.
IEEE, "Full Copper Wiring in a Sub–0.25$\mu$m CMOS ULSI Technology", D. Edelstein, et al., pp. 773–776, 1997.
"Technology Challenges for Advanced Interconnects", James G. Ryan, et al.

* cited by examiner

Primary Examiner—Carl Whitehead, Jr.
Assistant Examiner—Jamie L. Brophy
(74) Attorney, Agent, or Firm—Richard J. Botos

(57) ABSTRACT

A process for fabricating a semiconductor device with copper interconnects is disclosed. In the process of the present invention, a layer of dielectric material is formed on a substrate. At least one recess is formed in the layer of dielectric material. Barrier layers and seed layers for electroplating are then deposited over the entire surface of the substrate. The recess is then filled with copper by electroplating copper over the surface of the substrate. The electroplated copper has an average grain size of about 0.1 $\mu$m to about 0.2 $\mu$m immediately after deposition. The substrate is then annealed to increase the grain size of the copper and to provide a grain structure that is stable over time at ambient conditions and during subsequent processing. After annealing, the average grain size of the copper is at least about 1 $\mu$m in at least one dimension. The copper that is electroplated on the dielectric layer is then removed using an expedient such as chemical mechanical polishing. The copper that remains is the copper in the recess.

9 Claims, 1 Drawing Sheet

PROCESS FOR SEMICONDUCTOR DEVICE FABRICATION HAVING COPPER INTERCONNECTS

BACKGROUND OF THE INVENTION

1. Technical Field

This invention is directed to a process for fabricating integrated circuit devices and, in particular, to semiconductor devices that have copper interconnects.

2. Art Background

As devices are scaled to sub-micron dimensions, formation of reliable sub-micron interconnection (interconnects) becomes increasingly difficult. Many techniques have been used to form interconnects. However, as the dimensions of sub-micron interconnects get smaller, current techniques are becoming less useful.

For example, techniques that require the interconnects to be formed by patterning a layer of metal using lithographic techniques, in which the pattern defined in a layer of energy sensitive material is transferred into the underlying metal layer by etch expedient, have several problems. In these techniques, contact holes (windows or vias) are formed in a layer of a dielectric material. The contact holes are then filled with metal by depositing a metal layer over the dielectric layer. The portion of the deposited metal layer overlying the dielectric layer is then removed using an expedient such as etching or chemical mechanical polishing (CMP). The portion of the metal layer that remains is the portion in the contact holes formed in the dielectric layer.

A second layer of metal is then formed over the dielectric layer with the metal-filled contact holes. The second metal layer is patterned to form the interconnect wires in the conventional subtractive process. Typically the metal filling the contact holes is one metal (e.g., CVD (chemical vapor deposited) tungsten) and the patterned metal is a second metal (e.g., aluminum). The second metal layer is patterned using lithographic techniques.

Such a process has certain problems associated therewith. Specifically, the patterned aluminum layer is subject to sidewall corrosion. Also, the spaces between the patterned metal lines must be subsequently filled with a dielectric layer before further processing. Furthermore, the use of dissimilar metals for the interconnects (e.g., tungsten) and the wires (e.g., aluminum) adversely affects both the mechanical strength and the electrical quality of the interconnect.

Copper is currently under investigation as an interconnect material because it has a low cost and a low resistivity. However, it is difficult to etch copper. Therefore processes that require the metal interconnect to be etched are not useful for forming copper interconnects. A promising technique for forming interconnects is a dual damascene process (or a combination of two single damascene processes). In a dual damascene process a single dielectric layer is deposited and patterned using a two-step etch process. The first step etches contact openings through half or more of the dielectric layer thickness and the second etch step etches the contact openings through the remaining dielectric thickness to the underlying layer and also the interconnect channels (i.e., trenches) part way through the dielectric layer.

The dual damascene process is advantageous for copper interconnect formation compared to the conventional subtractive process because in dual damascene, lithographic techniques and etching expedients are not required to pattern a layer of copper. However, in dual damascene, copper deposition is complicated because the contact openings may have an aspect ratio (i.e. the ratio of the height to the width of the recess) of 2:1, 3:1, or more. The high aspect ratio makes sputter deposition difficult. Copper may be deposited by CVD within the contact openings and interconnect channels. However, copper is difficult and/or expensive to deposit by CVD. As a result, copper is not typically deposited by CVD in production.

Electroless metal deposition (i.e., electroless plating) has been investigated as a technique for depositing copper onto a patterned layer of dielectric material. In this technique the surfaces to be plated (e.g., contact openings (windows or vias) and interconnect channels) must be pretreated before the metal is deposited in order to effect electroless deposition. Low deposition rates and issues of bath stability make this approach unattractive for use in production. In addition, current surface activation techniques such as physical vapor deposition (PVD, e.g., sputtering) of a catalytic metal or treatment with an activating solution are either difficult or incompatible with current processes for device fabrication.

A major advantage of copper is its relatively low cost and low resistivity. However, it has a relatively large diffusion coefficient into silicon, silicon dioxide, and low dielectric constant polymers such as polyimide. Copper from an interconnect may diffuse through the silicon dioxide or polymer layer and into the underlying silicon. Copper diffusion into the underlying silicon substrate can degrade the transistor characteristics of the resulting device. Copper interconnects should be encapsulated by at least Ione diffusion barrier to prevent diffusion into the silicon dioxide layer. The formation of this diffusion barrier is another problem associated with copper interconnect formation.

As noted in U.S. Pat. No. 5,627,102 to Shinriki et al., one problem associated with the formation of metal interconnects is that voids form in the metal filling the recess. Such faulty fill-up leads to a failure to establish a sound electrical contact. The problem of faulty fill-up increases with increasing aspect ratios. Consequently, as the width of the recess decreases, the problems associated with faulty fill-up increase.

Accordingly, a process for making copper interconnects that addresses the current problems associated with copper interconnect formation is desired.

SUMMARY OF THE INVENTION

The present invention is directed to a process for semiconductor device fabrication in which at least one of the interconnects is made of copper. In the process of the present invention, a copper or copper alloy is electroplated into a recess formed in the surface of a dielectric layer on a semiconductor substrate (i.e., a single damascene process). The dielectric layer may be a material such as silicon dioxide or a low dielectric constant polymer such as, for example, polyimide or polyaryl ethers. For convenience, the recess is referred to as a trench, although one skilled in the art will appreciate that the configuration of the recessed portion is a matter of design choice.

Since copper may diffuse into the dielectric material, a barrier to copper diffusion is typically required. Such a barrier is typically formed on the recess in the dielectric layer before the copper is deposited therein. However, the barrier may also be formed by doping the copper and by outdiffusing the dopant material to form a barrier layer at the interface between the copper and the dielectric, after the copper is deposited in the recess, to prevent copper diffusion into the adjacent dielectric material. Materials that act as a barrier to copper diffusion are well known to one skilled in the art. Examples of suitable barrier materials include tantalum, tantalum nitride and titanium nitride. The thickness of a barrier layer is at least about 10 nm.

Before electroplating copper in the trench, a seed layer is formed therein. The thickness of the seed layer is at least about 5 nm. The seed layer acts as a cathode for electroplating copper into the recess. The copper seed layer is deposited using a conventional expedient such as PVD, CVD, or electroless plating.

A layer of copper is then electroplated onto the barrier-coated surface of the dielectric layer formed on the substrate. The copper layer is formed over the entire surface of the substrate. The copper layer is then polished back so that the only portion of the copper that remains is the portion of the copper in the trench. The electroplated copper layer is polished back using conventional expedients well known to one skilled in the art. Chemical mechanical polishing is one example of a suitable expedient.

Either before or after the electroplated layer of copper is polished, the substrate is then annealed. The temperature of the anneal, and the duration of the anneal, are selected to bring the grain structure of the electroplated copper from its as-deposited small grain state to a large grain state. For purposes of the present invention, a small grain state is an average grain size of about 0.1 $\mu$m to about 0.2 $\mu$m. A large grain state is a grain size that is at least one micron in at least one dimension. In certain embodiments, the grain size is constrained by the size of the recess in which the copper is deposited. For example, when the copper is deposited in a trench having a width of less than one micron, the average large grain size is at least as large as the width of the trench into which the copper is deposited and at least about 1 $\mu$m in the length direction of the trench. Within the defined range, the smaller the grain size when the copper is deposited, the better the fill. However, after the copper is deposited, it is advantageous to increase the grain size of the copper to the large grain state in order to improve the electrical characteristics of resulting device.

When small grain copper is electroplated using baths with organic additives, the grain structure of the copper is not stable at ambient conditions. In the process of the present invention, the electroplated copper is annealed after deposition in order to provide a copper grain structure that is stable over time.

In the embodiments of the present invention in which the width of the trench is about 0.1 $\mu$m to about 5 $\mu$m, it is advantageous if the average diameter of the grains in the plated copper film (in the as-deposited small grain state) is about 0.1 $\mu$m to about 0.2 $\mu$m. In order to obtain large grain state copper with the requisite stability, the substrate is annealed at a temperature in the range of about 100° C. to about 400° C. for about 1 minute to about 1 hour in a non-oxidizing environment. For purposes of the present invention, a non-oxidizing environment is either a vacuum or a non-oxidizing gas such as hydrogen, nitrogen, or argon.

After the copper layer is both polished back and annealed, a passivation layer is formed over the substrate. The passivation layer is intended to prevent the copper interconnect from oxidation and diffusion. One example of a suitable passivation layer material is silicon nitride ($Si_3N_4$).

DETAILED DESCRIPTION

Figure 1:
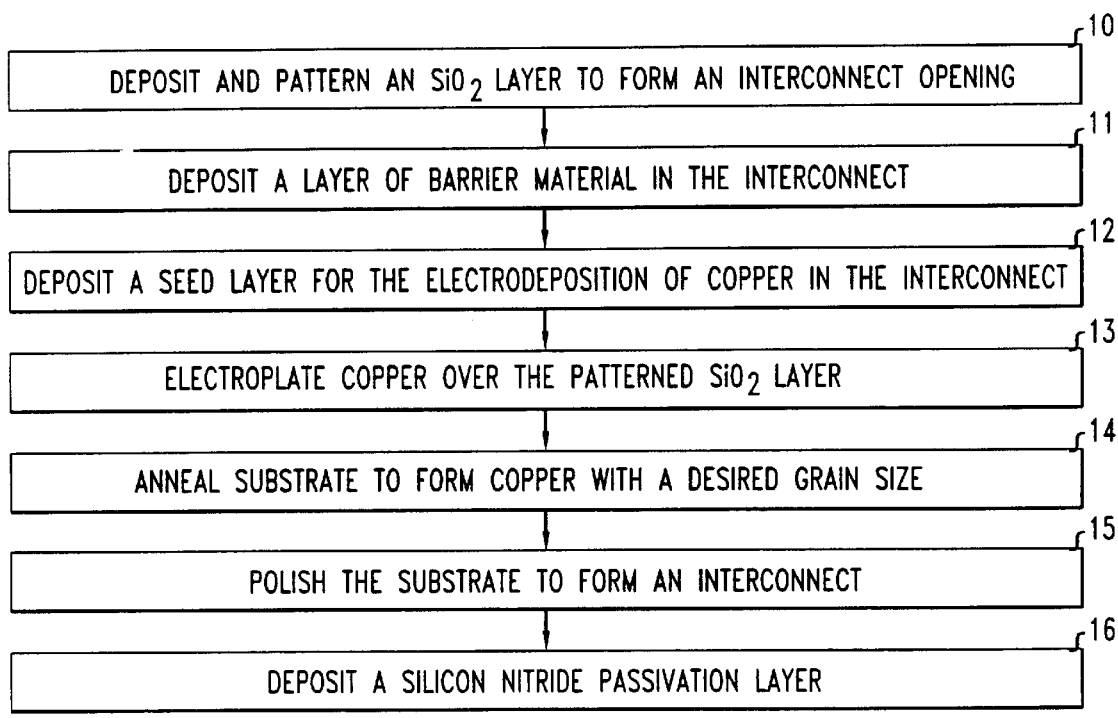
FIG. 1 is a flow diagram of one embodiment of the present invention.

The embodiments of the present invention form an interconnect channel and a copper-containing interconnect within a semiconductor device. In general, a dielectric layer is deposited over a substrate and patterned to form an interconnect channel. An interconnect layer is deposited over the patterned dielectric layer and within the interconnect channel. The substrate is polished with a polishing slurry to remove the portion of the interconnect layer that lies on the patterned dielectric layer, thereby forming the interconnect. Either before or after the interconnect layer is polished, the substrate is annealed. The temperature and duration of the anneal are selected to provide a copper-containing interconnect layer in which the copper has a desired grain size. The interconnect layer may include a barrier layer and a seed layer in addition to the copper layer. If needed, a diffusion barrier layer may be deposited before forming another interconnect level. A passivation layer is deposited over each interconnect level.

The interconnect level is typically formed over a layer of dielectric material with contacts formed therein. The interconnect is in electrical contact with at least one underlying metal feature (window, via) formed in the underlying dielectric layer. In the process of the present invention, the metal features in the underlying layer are also formed by electroplating copper.

A number of materials may be used with the present invention. In general, the dielectric layer is typically either silicon nitride, silicon dioxide doped or undoped), silicon oxynitride, fluoropolymer, polyaryl ether, or polyimide. The interconnect metal is copper.

Since copper has a tendency to diffuse into dielectric materials generally and silicon dioxide in particular, a layer of material that acts as a barrier to diffusion is required. This layer can be formed by either deposition of a barrier layer prior to electroplating copper onto the substrate, or by outdiffusion from the copper itself. If the barrier layer is a separate layer of material, examples include silicon nitride, phosphosilicate glass (PSG), silicon oxynitride, aluminum oxide ($Al_xO_y$), tantalum, titanium nitride, niobium, or molybdenum. These material are deposited by conventional expedients such as CVD or PVD.

The process of the present invention is used to make copper interconnects to device structures including polysilicon gates, word lines, source regions, drain regions, bit lines, base emitters, collectors, etc. It will be readily apparent to one skilled in the art that the present invention can be used with any semiconductor technology such as, for example, MOS (metal-oxide-semiconductor) devices (e.g., NMOS, PMOS, CMOS, and BiCMOS), bipolar devices, multi-chip modules, and III–V semiconductors.

FIG. 1 includes a flow diagram of one embodiment of the present invention. In step 10, a silicon dioxide layer is formed on a silicon substrate (the top layer of which is typically a patterned layer of dielectric material with contacts to underlying devices formed therein) and patterned to form an interconnect channel. In step 11 of the described embodiment, a layer that acts as a barrier to the diffusion of copper is deposited over the substrate and into the interconnect channel. In step 12, a layer of material that functions as a cathode during the subsequent electrodeposition of copper is formed over the patterned dielectric layer and in the interconnect channel.

In step 13, copper is then electroplated over the patterned dielectric layer and in the interconnect channel. In step 14 the substrate is then annealed to provide copper having a large grain structure with the requisite stability. The substrate is then chemically mechanically polished (15) to remove the portion of the copper layers that lies on the surface of the patterned silicon dioxide layer. In the process of the present invention, the polishing and annealing steps are performed interchangeably. A silicon nitride passivation layer is formed over each interconnect layer in step 16.

EXAMPLE 1

Damascene trenches were formed in a 0.5 μm thick layer of silicon dioxide formed on a 150 mm silicon wafers. The silicon dioxide layer was formed from PETEOS (plasma enhanced tetraethyl orthosilicate). The trenches were formed using eight different width and space combinations.

Trench widths were in the range of 0.3 μm to 5 μm. These widths represent interconnect widths that might be found from the lower to the upper levels of circuit wiring. The damascene trenches were prepared as grating arrays (i.e., many trenches of equal widths spaced equally apart). For the submicron trench widths (0.3 μm, 0.5 μm, and 0.8 μm) gratings with spacings ranging from roughly equal to the trench width to on the order of 3 μm were made to examine proximity effects.

After the trenches were formed, a 50 nm-thick layer of tantalum nitride was formed on the oxide using PVD. The tantalum nitride was a barrier to the diffusion of copper into the oxide and an adhesion layer. A 100 nm-thick layer of copper was then formed over the layer of tantalum nitride to serve as a cathode for electroplating. The copper film was also formed by PVD. The PVD films were formed sequentially on the wafers, without a vacuum break, by DC magnetron sputtering in a M2i™ cluster deposition tool from Novellus of San Jose, Calif. The tantalum nitride was deposited using 3 kW power (no bias) and a 1:1 collimator. The deposition pressure was 2.9 mTorr and the flow rates of argon and nitrogen were both 35 sccm. The wafer temperature was 150° C. The copper was deposited using 3.1 kW of power (no bias) and a 1:1 collimator. The deposition pressure was standard for PVD copper deposition and the flow rate of argon was 35 sccm. The wafer temperature was 50° C.

The copper was electroplated onto the wafers using an Equinox™ fountain plating system from Semitool of Kalispell, Mont. The wafers were placed in an CUBATH® SC bath that is commercially obtained from Enthone. The bath had a copper sulfate/sulfuric acid plating chemistry. A pulse waveform with a current of 4.9 amp cycled at 95 msec on and 35 msec off was used to electroplate the copper onto the substrate. Copper was plated to a coulometric equivalent of a 1 μm film on an unpatterned 150 mm diameter silicon wafer. The copper films, as plated, were observed to be fine-grained and highly reflective, with a uniform grain size of about 0.1 μm to about 0.2 μm.

Some of the copper-plated substrates were then annealed at 400° C. for one hour in a tube furnace at atmospheric pressure in forming gas ($N_2$/10% $H_2$). The grain size of the annealed copper films were compared with the grain size of unannealed copper films. The grain size of the unannealed copper films was observed to increase over time. At room temperature, the grain size of the unannealed copper films increased from an as-deposited average diameter of 0.1 μm to 0.2 μm. Over a period of hours to weeks, the grain size of the unannealed films was observed to increase to greater than 1 μm. The increase in grain size did not occur uniformly. The grain size increase began at isolated points (nucleation sites) in the film and the size of the sites and the number of sites was observed to increase over time. Such change in the copper grain size over a long period of time is not desired because it is uncontrolled and dynamic. The copper film had a mixture of large and small grains for a long period of time.

By contrast, the annealed copper had a uniformly large grain size structure. There was no mixture of large and small grains. The grain size of copper films that were annealed (either before or after the films were subjected to CMP) was not observed to significantly increase over time.

The grain size of the copper in its as-deposited state is affected by the composition of the electroplating bath that is used to electroplate the copper on the substrate. Specifically, it was observed that only baths that contained organic compounds provided copper films with the desired as-deposited grain size (about 0.1 μm to about 0.2 μm). When an acid-based copper sulfate electroplating bath chemistry without organic additives was used, the resulting electroplated copper had an average as-deposited grain size that was too large to provide the desired fill. Although applicants do not wish to be held to a particular theory, it is applicants' belief that electroplated copper films with the desired as-deposited small grain size are only obtained when copper electroplating bath chemistries that contain organic compounds (as either ligands, brighteners, leveling agents, etc.) are used.

What is claimed is:

1. A process for device fabrication comprising:

forming a layer of a dielectric material on a substrate;

forming at least one recess in the layer of dielectric material;

filling the recess in the dielectric material with electroplated copper wherein the electroplated copper has an average grain size of about 0.1 μm to about 0.2 μm; and annealing the substrate at conditions that increase the average grain size of the electroplated copper to at least 1 μm in at least one dimension.

2. The process of claim 1 wherein the substrate is annealed at a temperature in the range of about 100° C. to about 400° C. for a duration of about one minute to about one hour.

3. The process of claim 1 wherein a barrier layer is formed in the recess before the copper is electroplated onto the substrate.

4. The process of claim 3 wherein a seed layer is formed over the barrier layer before the copper is electroplated onto the substrate.

5. The process of claim 4 wherein the seed layer is formed over the recess.

6. The process of claim 1 further comprising selectively removing a portion of the electroplated copper leaving only the electroplated copper in the recess.

7. The process of claim 1 wherein the recess has a length, a width, and a height.

8. The process of claim 7 wherein the average grain size after anneal is at least as wide as the recess and at least one micron in the length direction of the recess.

9. The process of claim 1 wherein the copper is electroplated from an electroplating bath comprising copper and at least one organic compound.

\* \* \* \* \*